(12) United States Patent
Kang et al.

(10) Patent No.: US 11,120,970 B2
(45) Date of Patent: Sep. 14, 2021

(54) ION IMPLANTATION SYSTEM

(71) Applicant: SHANGHAI IC R&D CENTER CO., LTD., Shanghai (CN)

(72) Inventors: Xiaoxu Kang, Shanghai (CN); Shaohai Zeng, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 34 days.

(21) Appl. No.: 16/620,859

(22) PCT Filed: Jun. 30, 2017

(86) PCT No.: PCT/CN2017/091084
§ 371 (c)(1),
(2) Date: Dec. 9, 2019

(87) PCT Pub. No.: WO2018/227668
PCT Pub. Date: Dec. 20, 2018

(65) Prior Publication Data
US 2020/0203124 A1    Jun. 25, 2020

(30) Foreign Application Priority Data

Jun. 16, 2017  (CN) .......................... 201710456328.8
Jun. 16, 2017  (CN) .......................... 201710456644.5
(Continued)

(51) Int. Cl.
*H01J 37/00*  (2006.01)
*H01J 37/317*  (2006.01)
*H01L 21/265*  (2006.01)

(52) U.S. Cl.
CPC ........ *H01J 37/3171* (2013.01); *H01L 21/265* (2013.01)

(58) Field of Classification Search
USPC .................................................. 250/492.21
See application file for complete search history.

(56) References Cited

U.S. PATENT DOCUMENTS

| 4,825,087 | A | * | 4/1989 | Renau | ................... | H01J 37/026 |
| | | | | | | 250/492.2 |
| 6,714,033 | B1 | * | 3/2004 | Makhratchev | ..... | G01R 19/0061 |
| | | | | | | 324/750.26 |

(Continued)

*Primary Examiner* — Phillip A Johnston
(74) *Attorney, Agent, or Firm* — Tianchen LLC; Yuan R. Li; Yi Fan Yin

(57) ABSTRACT

The invention provided an ion implantation system. The ion implantation system comprises an ion emitting device and a target plate device; the target plate device comprises a graphite electrode unit and a power supply unit; the graphite electrode unit is mounted on the lower end of a support frame, and the graphite electrode unit is a hollow structure; the graphite electrode unit comprises a graphite electrode and a hollow region I, the graphite electrode is connected to the power supply unit; the area of the hollow region I is smaller than that of the wafer to be processed, and the sum of the area of the graphite electrode and the area of the hollow region I is larger than an implantation area of the ion beam. When the ion beam is implanted to the wafer to be processed on a target plate for ion implantation, the power supply unit applies a voltage to the graphite electrode to generate an electric field in the opposite direction from the electric field generated by the ion beam motion, accordingly, the speed of the ion beam implanted to a location outside the wafer to be processed is reduced, and secondary contamination during ion implantation is avoided, so as to perform an ion implantation process more efficiently.

12 Claims, 4 Drawing Sheets

(30) Foreign Application Priority Data

Jun. 16, 2017 (CN) .......................... 201710456645.X
Jun. 29, 2017 (CN) .......................... 201710515940.8

(56) References Cited

U.S. PATENT DOCUMENTS

| | | | | |
|---|---|---|---|---|
| 6,847,043 B2* | 1/2005 | Murrell | ................... | H01J 37/08 |
| | | | | 250/423 R |
| 7,078,710 B2* | 7/2006 | Desai | ..................... | H01J 37/02 |
| | | | | 250/492.2 |
| 8,057,146 B2* | 11/2011 | Zeytoonian | ............ | H01J 37/09 |
| | | | | 411/372.5 |
| 9,502,210 B2* | 11/2016 | Sano | ..................... | H01J 37/244 |
| 9,865,422 B2* | 1/2018 | Horsky | ................. | H01J 27/022 |
| 2008/0061340 A1* | 3/2008 | Heineck | ............ | H01L 27/10891 |
| | | | | 257/301 |
| 2014/0008352 A1* | 1/2014 | Uemura | ................... | H05B 6/62 |
| | | | | 219/601 |

* cited by examiner

ION IMPLANTATION SYSTEM

CROSS-REFERENCE TO RELATED APPLICATION

This application claims priority of International Patent Application Serial No. PCT/CN2017/091084, filed Jun. 30, 2017, which is related to and claims priority of Chinese patent application serial No. 201710456645.X, 201710456644.5, 201710456328.8 filed Jun. 16, 2017, and 201710515940.8 filed Jun. 29, 2017. The entirety of each of the above-mentioned patent applications is hereby incorporated herein by reference and made a part of this specification.

TECHNICAL FIELD

The invention relates to the technical field of ion implantation, in particular to an ion implantation system.

BACKGROUND

The ion implanter is a key equipment in an integrated circuit manufacturing process. Ion implantation is ionizing elements to be implanted, the positive ions are separated and accelerated to form a high-energy ion flow with the tens of thousands of electron volts used for bombarding the workpiece surface. The ions are driven into the surface layer due to the fact that the kinetic energy is large, and the charges of the ions are neutralized to become an interstitial atom between substitutional atoms or lattices, and the interstitial atom is remaining in the surface layer, so that the chemical composition, the structure, and the performance of the material are changed. Compared with a conventional thermal doping process, the ion implantation can accurately control the implantation dosage, the implantation angle, the implantation depth, the lateral diffusion and the like. Therefore, the ion implanter is widely used in a doping process and has become an indispensable key equipment in an integrated circuit manufacturing process.

In the ion implanter, the ionized ions from the ion source enter the target plate device through acceleration by an intermediate apparatus to bombard the surface of a wafer to complete the ion implantation process. In order to efficiently perform ion implantation on the wafer to be processed, the width range of the implanted ions is required to be larger than the area of the wafer, so that the surface of the wafer can be effectively subjected to ion implantation in the one-time implantation process. As the semiconductor manufacturing technology enters 12-inch or even larger silicon wafer sizes, in order to adapt to larger-size silicon wafers or other wafers, a wide-beam scanning with larger scanning range is adopted in the ion implantation technology and gradually becomes a mainstream technology of the implanter.

In the ion implantation process of the wide-beam scanning, the beam current width is larger than the width of the wafer to be processed, so that the ion beam which is not implanted into the wafer to be processed is bombarded on back walls or other parts of the target plate device. After the high-energy ion bombardment, the bombarded part can generate metal ions or other particles, which will generate particle and metal contaminations on the wafer to be processed, so that the wafer to be processed is subjected to secondary contamination in the ion implantation process, and the result of the ion implantation process is not ideal. Meanwhile, the traditional ion implantation system adopts a single faraday cup to detect the parallel performance of the implanted ions in the ion implantation process, the efficiency is low, and the detection result is not accurate. In addition, the traditional ion implantation system also has defects that ionized large atomic groups are difficult to form, and the number of ions is too small in the implantation process.

SUMMARY

This disclosure aims to overcome the defects in the prior art, the disclosure is to provide an ion implantation system which comprises an ion emitting device and a target plate device, the target plate device can decelerate the ion beam which is bombarded outside the wafer to be processed, the ion beam is prevented from bombarding other parts of the target plate device, the parallel performance of the ion beam can be adjusted, and the ion emitting device can increase the ion implantation beam current or increase the volume of the formed ionic group.

In order to achieve the above purposes, the present disclosure adopts the following technical solution:

An ion implantation system comprises an ion emitting device and a target plate device, wherein the target plate device comprises a target plate and a support frame, and the target plate is used for placing a wafer to be processed which is mounted on the upper end of the support frame; the ion beam emitted by the ion emitting device enters the target plate device and is implanted into the wafer to be processed so as to realize the ion implantation process; wherein, the target plate device further comprises a graphite electrode unit and a power supply unit, the graphite electrode unit is mounted on the lower end of the support frame, and the graphite electrode unit is a hollow structure; the graphite electrode unit comprises a graphite electrode and a hollow region I, the graphite electrode is connected with the power supply unit; the area of the hollow region I is smaller than that of the wafer to be processed, the sum of the area of the graphite electrode and the area of the hollow region I is larger than the implantation area of the ion beam, the center of the wafer to be processed and the center of the hollow region I are located on the same straight line parallel to the implanted direction of the ion beam; when the ion beam is implanted into the wafer to be processed on the target plate for ion implantation, the power supply unit applies a voltage to the graphite electrode to generate an electric field in the opposite direction from the electric field generated by the ion beam motion, for reducing the speed of the ion beam implanted to a location outside the wafer to be processed.

Preferably, wherein the area of the target plate is smaller than that of the wafer to be processed. Preferably, wherein a shielding unit is arranged between the target plate and the graphite electrode, and the shielding unit is a hollow structure, the shielding unit comprises a hollow region II and a shielding region, the area of the hollow region II and the area of the hollow region I are the same, and the center of the hollow region II and the center of the hollow region I are located on the same straight line parallel to the implanted direction of the ion beam, the sum of the area of the hollow region II and the area of the shielding region is larger than the area of the wafer to be processed.

Preferably, wherein, the shielding region is a porous grounding electrode or an electron region implanted by an electron gun.

Preferably, wherein the target plate device further comprises a faraday cup array, a micro-magnetic field array, and a control unit, the faraday cup array is composed of faraday cups arranged on the same plane, the faraday cup array and the wafer to be processed are located on the same plane, and the positions in the plane can be switched; a micro-magnetic field array is arranged above the target plate towards the ion beam, and the control unit is connected with the micro-magnetic field array and the faraday cup array respectively; when the ion beam is implanted, the faraday cup array is switched to the ion beam implantation position, the ion beam passing through the faraday cups at different positions in the faraday cup array to obtain current values corresponding to the ion beam at different positions, and the current values are fed back to the control unit, the control unit adjusts the micro-magnetic field array according to the current values, the micro-magnetic field array adjusts the ion beam until the current values corresponding to the faraday cups at different positions in the faraday cup array are equal; here, the wafer to be processed is switched to the ion beam implantation position; the ion implantation is carried out on the wafer to be processed on the target plate by the ion beam.

Preferably, wherein the area of the faraday cup array is smaller than or equal to the area of the ion beam, the area of the micro-magnetic field array is larger than implantation area of the ion beam, and the micro-magnetic field array is an annular micro-magnetic field array.

Preferably, wherein the ion emitting device comprises an ion source, a first extraction electrode, a storage magnetic field, and a magnetic analysis component, the first extraction electrode is arranged in the outlet direction of the ion source, the storage magnetic field is deflected by a certain angle relative to the outlet direction of the first extraction electrode, and the angle enables the ions passing through the first extraction electrode to enter the storage magnetic field to do circular motion; the storage magnetic field is an annular magnetic field, the magnetic analysis component is used for detecting and separating the ions in the storage magnetic field, and the ions ionized by the ion source are led out through the first extraction electrode, the ions led out by the first extraction electrode enter the storage magnetic field to do circular motion; when the number of the ions in the storage magnetic field reaches a predetermined value, the ions in the storage magnetic field are released into the magnetic analysis component.

Preferably, wherein the ion emitting device further comprises a second extraction electrode, the second extraction electrode is arranged in the middle of the storage magnetic field and the magnetic analysis component; when the number of the ions in the storage magnetic field reaches a predetermined value, the ions in the storage magnetic field are led out by the second extraction electrode to the magnetic analysis component.

Preferably, wherein the storage magnetic field is provided with an openable gap, and the magnetic analysis component is arranged in the tangential direction of the gap; when the number of the ions in the storage magnetic field reaches a predetermined value, the storage magnetic field opens the gap, and the ions in the storage magnetic field moves to the magnetic analysis component along the tangent line of the gap.

Preferably, wherein the ion emitting device further comprises a deflection magnetic field, the storage magnetic field is provided with an openable gap, the deflection magnetic field is connected with the gap of the storage magnetic field and the magnetic analysis component; when the number of the ions in the storage magnetic field reaches a predetermined value, the storage magnetic field opens the gap, the ions coming out of the storage magnetic field enters the magnetic analysis component through the deflection magnetic field.

Preferably, wherein the ion emitting device comprises an ion source generating chamber, a target material chamber, a chamber for implanting atomic or ionic or molecular group enlarging and a magnetic field analysis chamber, the ion source generating chamber is used for generating ion source, and a part of the ion source coming out of the ion source generating chamber enters the target material chamber to bombard the target material, so that the ions, the atoms, the molecules, and the atomic groups are bombarded out from the target material and colliding with each other, so as to generate the atomic groups; the atomic groups from the target material chamber enter into the chamber for implanting atomic or ionic or molecular group enlarging; meanwhile, a part of the ion source coming out of the ion source generating chamber enter the chamber for implanting atomic or ionic or molecular group enlarging and is subjected to spiral motion to collide with the atomic groups from the target material chamber to enable the atomic groups to be electrified so that the ratio of the large atomic or ionic or molecular groups is increased; the large atomic or ionic or molecular groups from the chamber for implanting atomic or ionic or molecular group enlarging enter the magnetic field analysis chamber and are subjected to charge-to-mass ratio screening; and the charged atomic groups with the required charge-to-mass ratio are selected.

Preferably, wherein the target material is placed in a tilted position or in an inner conical shape in the target material chamber.

The method has the beneficial effects that:

①. the graphite electrode is placed in the target plate device, and a certain voltage is applied to the graphite electrode, the ion beam that bombards on the graphite electrode is slowed down so that other parts of the target plate device are prevented from bombarding by the ion beam, and the particles generated by secondary contamination and the ions generated bombardment are not produced. Meanwhile, a shielding unit is arranged between the target plate and the graphite electrode, so that the electric field generated by the graphite electrode is prevented from affecting the implantation uniformity of the ion beam on the wafer to be processed.

②. Adding a faraday cup array for detecting parallel performance of ion beam on the plane where the wafer to be processed is located, a micro-magnetic field array is arranged above the target plate towards the ion beam and is used for adjusting the ion beam so that the current value of the ion beam is the same as the current value of the faraday cup array; by adjusting and detecting the ion beam, scattering phenomenon of implanted ions is avoided, and the parallel performance of the implanted ions is improved.

③. The ions ionized by the ion source is stored by a storage magnetic field, and when the number of the ions in the storage magnetic field reaches a predetermined value, and the ions stored in the magnetic field are led out to the magnetic analysis component to be detected and separated by adopting a second extraction electrode or a method for directly opening the gap of the storage magnetic field. Through the storage effect of the storage magnetic field, the number of ions in the implanted ions beam is greatly increased, the uniformity of the ion implantation process is improved, and meanwhile, the scanning time is shortened.

④. An ion source is generating by a single chamber, and the ion source is introduced into the target material chamber through a magnetic field; in the target material chamber, the target material needs to be implanted is placed at a certain angle in the chamber, the ion source is used for bombarding the target material, and the ions, the atom, the molecules, the atomic group and the like which are removed from the target material by the ion source, can collide with each other, the ratio of the large atomic or ionic or molecular group/ionic group is increased, and then the electrons are subjected to reciprocating motion in the magnetic field, the atomic group are ionized, and a correct cluster ion implantation source led out by the extraction voltage is selected through the magnetic field, so that the ionized large atomic group is realized and the large atomic group implantation is carried out.

Wherein: 11 an ion beam, 12 a target plate, 13 a wafer to be processed, 14 a graphite electrode, 15 a hollow region I, 16 a shielding region, 18 a hollow region II, 19 a support frame, 23 a micro-magnetic field array, 24 a faraday cup array, 27 a fixed connecting device

DETAILED DESCRIPTION

In order to make the contents of the present disclosure more comprehensible, the contents of the present disclosure are further described below in conjunction with the description of the specification. The invention is not limited to the specific embodiment, and general substitutions well known to those skilled in the art are also contemplated within the protection scope of the present disclosure.

Figure 1:
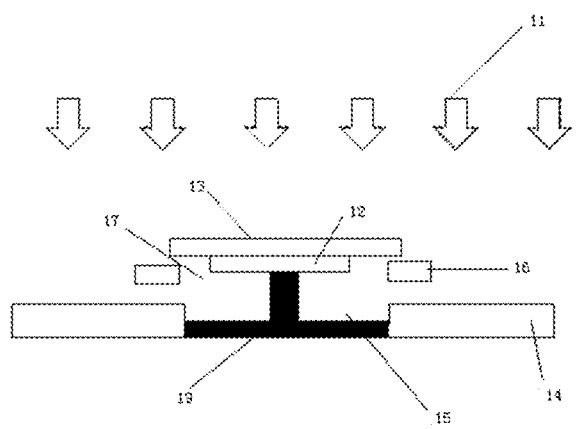
FIG. 1 is a schematic structural diagram of a target plate device comprising a graphite electrode unit and a shielding unit.

The invention provides an ion implantation system that comprises an ion emitting device and a target plate device. As shown in FIG. 1, the target plate device comprises a target plate 12 and a support frame 19, the target plate 12 is arranged at the upper end of the support frame 19 and is used for placing a wafer to be processed 13. The ion beam enters the target plate device and implants on the wafer to be processed 13, to realize the ion implantation process, wherein the ion implantation system further comprises a graphite electrode unit and a power supply unit, and the graphite electrode unit is arranged at the lower end of the support frame, the graphite electrode unit is a hollow structure and comprises a graphite electrode 14 and a hollow region I 15. The graphite electrode 14 is connected with the power supply unit, and the area of the hollow region I 15 is smaller than that of the wafer to be processed. The sum of the area of the graphite electrode 14 and the area of the hollow region I 15 is larger than the implantation area of the ion beam, the center of the wafer to be processed 13 and the center of the hollow region I 15 are located on the same straight line parallel to the implanted direction of the ion beam. When the target plate is rectangular, the graphite electrode unit is a rectangle with a hollow structure, and the rectangular area of the hollow region I is smaller than that of the wafer to be processed, the sum of the area of the graphite electrode and the area of the hollow region I is larger than implantation area of the ion beam. When the target plate is round, the graphite electrode is an annular structure, and the inner diameter of the graphite electrode is smaller than the radius of the wafer to be processed, the sum of the area of the graphite electrode and the area of the hollow region I is larger than the area of the implantation area of the ion beam. Regardless of the shape of the wafer to be processed and the shape of the target plate, the area of the hollow region I is smaller than that of the wafer to be processed, the sum of the area of the graphite electrode and the area of the hollow region I is always larger than the area of the implantation area of the ion beam.

A shielding unit is installed between the target plate 12 and the graphite electrode unit, and the shielding unit is a hollow structure and comprises a hollow region II 18 and a shielding region 16, the area of the hollow region II 18 and the area of the hollow region I 15 are the same, and the center of the hollow region II and the center of the hollow region I are located on the same straight line parallel to the implanted direction of the ion beam, the sum of the area of the hollow region II and the area of the shielding region is larger than the area of the wafer to be processed. The shielding region can be a porous grounding graphite electrode; the periphery of the target plate can also be provided with an electron gun; the shielding region is an electron region implanted by an electron gun.

Because the implantation area of the ion beam is larger than the area of the wafer to be processed, when the ion beam is implanted, a part of the ion beam cannot be implanted to the surface of the wafer to be processed, and the ion beam can bombard other parts of the target plate device. The other parts in the target plate device are mostly made of metal, the ion beam bombards the metal surface to generate metal ions, and particles are generated in the bombardment process, which will result in secondary contamination of the target plate device. By placing the graphite electrode unit with the hollow structure below the wafer to be processed during ion implantation, the excess ion beam will be slowed down in the electric field generated by the graphite electrode and will not bombard other parts of the target plate device. Meanwhile, the graphite electrode is a hollow structure, so that the material of the graphite electrode can be saved, and the electric field generated by the graphite electrode can be prevented from affecting the energy of the ion beam implanted on the wafer to be processed.

When ion beam is implanted on a wafer to be processed on a target plate for ion implantation, the power supply unit applies a voltage to the graphite electrode, the electric field opposite to the electric field direction formed by the movement of the ion beam is generated, and the incidence speed of the ion beam which is implanted outside the wafer to be processed is reduced. When the ion beam is positively charged ions, the power supply unit applies a positive voltage to the graphite electrode; when the ion beam is negatively charged ions, the power supply unit applies a negative voltage to the graphite electrode.

The electric field generated by the graphite electrode reduces the speed of the ion beam, and the area of the hollow region I is smaller than that of the wafer to be processed, so that the speed of the high-energy electron beam implanted on the edge of the wafer to be processed can be affected, it will result in defect on uniformity of the ion implantation on the wafer to be processed. Therefore, it is necessary to eliminate the effect of the graphite electrode on the ion beam in the incidence range of the wafer to be processed. A shielding unit is arranged between the target plate and the graphite electrode unit, the hollow region II in the shielding unit corresponds to the hollow region I, and the implanted ion beam in the region is implanted into the wafer to be processed, the sum of the area of the hollow region II and the area of the shielding region is slightly larger than the area of the wafer to be processed, and the shielding region and the graphite electrode form a capacitor so that an electric field generated by the graphite electrode is prevented from affecting the ion beam implanted on the edge of the wafer to be processed.

The target plate device further comprises a faraday cup array, a micro-magnetic field array, and a control unit. The target plate is used for placing the wafer to be processed, and the faraday cup array is composed of faraday cups arranged on the same plane, the faraday cup array and the wafer to be processed are located on the same plane, the positions in the plane can be switched, and a micro-magnetic field array is arranged above the target plate towards the ion beam, the control unit is respectively connected with the micro-magnetic field array and the faraday cup array. When the ion source starts to emit the ion beam, the faraday cup array is switched to the ion beam implantation position, the ion beam passing through faraday cups at different positions in the faraday cup array to obtain current values corresponding to the ion beam at different positions, and the current values are fed back to the control unit, the control unit adjusts the micro-magnetic field array according to the current values, the micro-magnetic field array adjusts the ion beam until the current values corresponding to the faraday cups at different positions in the faraday cup array when the ion beam passes through are equal. Here, the wafer to be processed is switched to the ion beam implantation position; the ion implantation is carried out on the wafer to be processed on the target plate by the ion beam.

Figure 2:
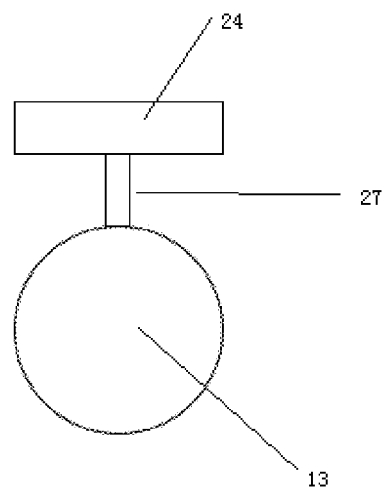
FIG. 2 is a schematic plan view of a faraday cup array and a wafer to be processed.

As shown in FIG. 2, the faraday cup array 24 and the wafer to be processed 13 are located on the same plane and are connected through a fixed connecting device 27, when the wafer to be processed 13 is moved, which will drive the faraday cup array 24 to do a corresponding movement, so that the movement of the wafer to be processed cannot touch the faraday cup array, and the arrangement position of the faraday cup array is not affected.

Wherein, the area of the faraday cup array is smaller than or equal to the area of the ion beam, and the function of the faraday cup array is to detect the parallel performance of the ion beam during ion implantation of the wafer to be processed. When the area of the faraday cup array is equal to the area of the ion beam, the parallel performance of the ion beam implanted on the wafer to be processed can be detected in one time. When the area of the faraday cup array is smaller than the area of the ion beam, the faraday cup array can detect in the plane where the faraday cup array is located along the X-axis and/or the Y-axis direction, namely, the length of the faraday cup array in the X-axis is larger than or equal to the width of the ion beam in the X-axis direction, and the length of the Y-axis is smaller than the width of the ion beam in the Y-axis direction, the faraday cup array can detect in the Y-axis direction, through movement on the Y-axis the faraday cup array can detect the parallel performance of all positions in the ion beam. Similarly, when the length of the faraday cup array in the Y-axis is larger than or equal to the width of the ion beam in the Y-axis direction, and the length of the X-axis is smaller than the width of the ion beam in the X-axis direction, the faraday cup array can detect in the X-axis direction, through movement on the X-axis, the faraday cup array can detect the parallel performance of all positions in the ion beam. The arrangement and the interval distance of individual cups in the faraday cup array can be set according to the requirement of uniformity for the wafer to be processed during the ion implantation, the individual faraday cups are arranged, the more accurate the parallel performance detection result of the ion beam will be. The area of the ion beam is smaller than or equal to the area of the wafer to be processed. When the area of the ion beam is equal to the area of the wafer to be processed, the ion implantation of the wafer to be processed can be completed by one-time implantation of the ion beam. When the area of the ion beam is smaller than the area of the wafer to be processed, the ion beam needs to detect in the X-axis direction and/or the Y-axis direction, so that ion implantation of the wafer to be processed can be realized in all directions. Namely, the width of the ion beam in the X-axis is larger than or equal to the diameter of the wafer to be processed in the X-axis direction, and the width of the Y-axis is smaller than the diameter of the wafer to be processed in the Y-axis direction, the ion beam needs to detect in the Y-axis direction; the ion beam can be subjected to ion implantation on all surfaces of the wafer to be processed by moving on the Y-axis. Similarly, when the width of the ion beam in the Y-axis is larger than or equal to the diameter of the wafer to be processed in the Y-axis direction, and the width in the X-axis is smaller than the diameter of the wafer to be processed in the X-axis direction, the ion beam needs to detect in the X-axis direction, and the ion beam can be subjected to ion implantation on all surfaces of the wafer to be processed through movement on the X-axis. Similarly, when the widths of the ion beam on the X-axis and the Y-axis are smaller than the diameters of the wafers to be processed on the X-axis and the Y-axis, the ion beam needs to detect in the X-axis and the Y-axis, and the wafer to be processed can be subjected to complete ion implantation. Similarly, for the selection of ion beams, which can select one or more ion beams incident at the same time, so that the detecting range of the ion beam can cover all surfaces of the wafer to be processed.

Figure 3:
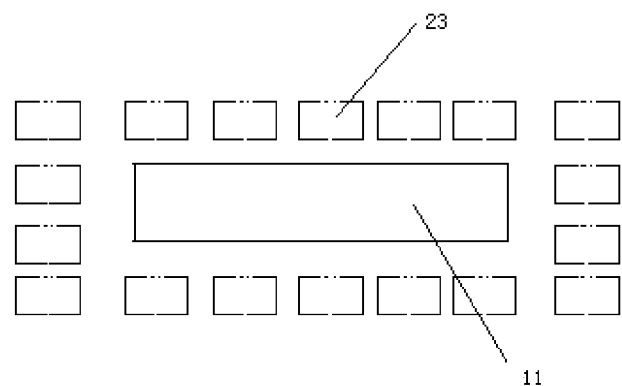
FIG. 3 is a schematic plan view of a micro-magnetic field array and an ion beam.

As shown in FIG. 3, the area of the micro-magnetic field array 23 is larger than the area of the ion beam and the micro-magnetic field array 23 is an annular micro-magnetic field array. In the process that an ion beam is emitted and implanted to the surface of the wafer to be processed, the ion flow at the central position of the ion beam does not change, but the ion flow at the edge position of the ion beam can be influenced by external factors and deflect. Therefore, an annular micro-magnetic field array is arranged and aims to correct the edge ion flow of the ion beam. The position of the micro-magnetic field array is close to the plane where the wafer to be processed is located on, and the specific position of the micro-magnetic field array can be set according to the size of the micro-magnetic field array.

Figure 4:
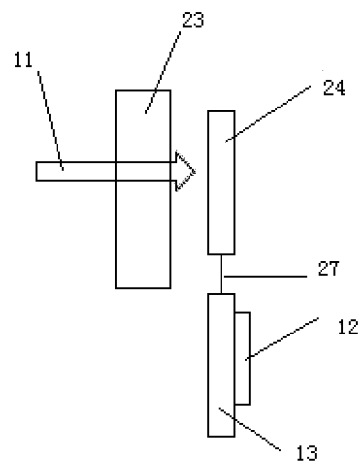
FIG. 4 is a schematic structural diagram of detecting and adjusting the parallel performance of ion beam.

As shown in FIG. 4, when the ion beam is implanted, the faraday cup array 24 is switched to the implantation position of the ion beam 11, the ion beam 11 passes through the faraday cups at different positions in the faraday cup array, so as to obtain current values corresponding to the ion beam at different positions, wherein the faraday cup array can be scanned in the X-axis direction and/or the Y-axis direction, and the current values are fed back to the control unit (not shown in the figure), and the control unit adjusts the micro-magnetic field array 3 according to the current values, the micro-magnetic field array is used for adjusting the ion beam until the current values corresponding to the faraday cup at different positions in the faraday cup array are equal.

Figure 5:
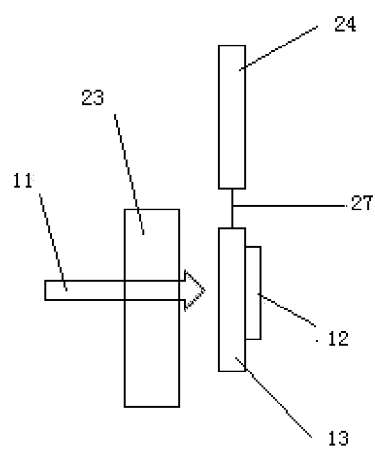
FIG. 5 is a schematic structural diagram of ion implantation through a faraday cup.

As shown in FIG. 5, after the parallel performance of the ion beam is adjusted, the wafer to be processed 13 is switched to the ion beam implantation position, wherein, ion beam can be scanned in the X-axis direction and/or the Y-axis direction; ion implantation is carried out on the wafer to be processed 13 on the target plate 12 by the ion beam 11.

The ion emitting device comprises an ion source, a first extraction electrode, a storage magnetic field, and a magnetic analysis component. The first extraction electrode is arranged in the outlet direction of the ion source, the first extraction electrode is an electric field, and the voltage generating the electric field is a direct-current voltage. The storage magnetic field is deflected by a certain angle relative to the outlet direction of the first extraction electrode, and the angle enables the ions passing through the first extraction electrode to enter the storage magnetic field to do a circular motion. The magnetic analysis component is used for detecting and separating the ions in the storage magnetic field, and ions ionized by the ion source are led out through the first extraction electrode, the ions led out by the first extraction electrode enter the storage magnetic field to do circular motion; when the number of ions in the storage magnetic field reaches a predetermined value, the ions in the storage magnetic field are released into the magnetic analysis component.

The storage magnetic field can be any magnetic field covering ion movement. Since charged ions enter the storage magnetic field to do circular motion, the annular magnetic field capable of covering the moving track of the charged ions can meet the requirements of storage ions. The setting mode of the annular magnetic field is simple and fast.

The advantage of increasing the storage magnetic field is that the charged ions ionized by the ion source are concentrated, and the number of ions ionized by the ion source is limited, as the size of the wafer becomes larger, the required ion beam current becomes larger when the ion implantation process is carried out. The storage magnetic field can enable the ions to be concentrated, and when the number of ions in the storage magnetic field reaches a process threshold value, the charged ions in the storage magnetic field are completely released.

Figure 6:
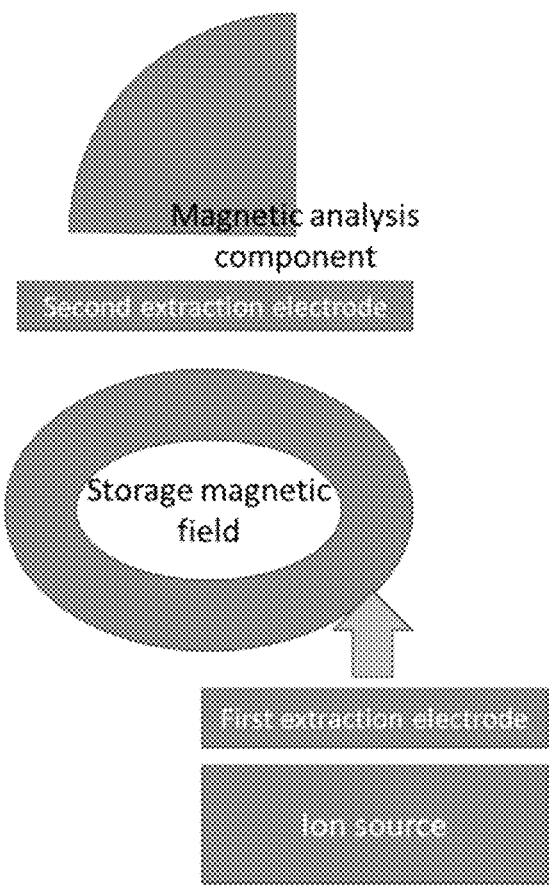
FIG. 6 is a schematic diagram of a first ion emitting device for increasing ion implantation beam current.

Specifically, the magnetic analysis component can be led out in three ways:

①. As shown in FIG. 6, a second extraction electrode is arranged between the storage magnetic field and the magnetic analysis component, when the number of the ions in the storage magnetic field reaches a predetermined value, the second extraction electrode starts to work, and the ions in the storage magnetic field are led out to the magnetic analysis component.

Figure 7:
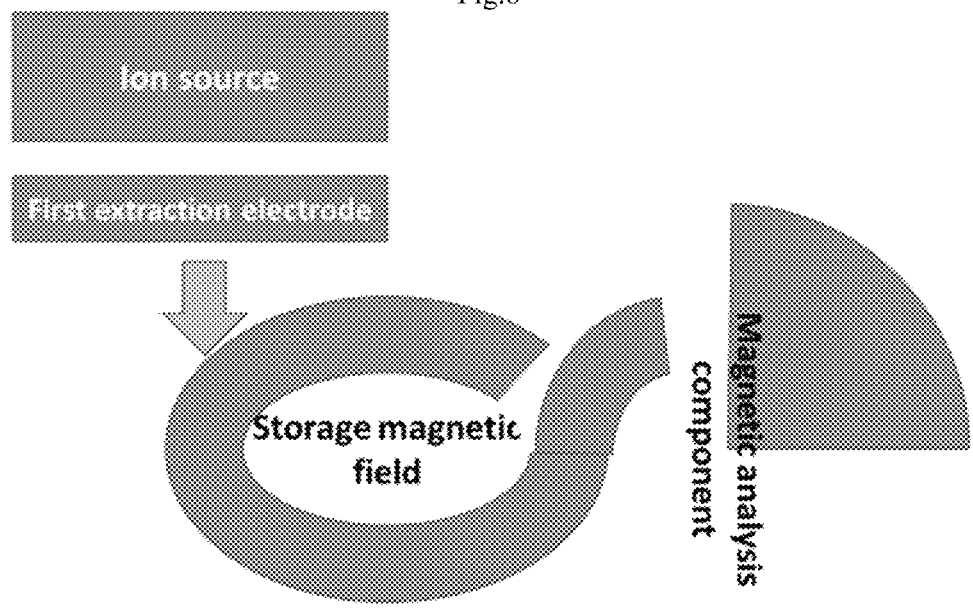
FIG. 7 is a schematic diagram of a second ion emitting device for increasing ion implantation beam current.

②. As shown in FIG. 7, an openable gap is provided with the storage magnetic field, and a deflection magnetic field is arranged between the gap of the storage magnetic field and the magnetic analysis component, when the number of the ions in the storage magnetic field reaches a predetermined value, the storing magnetic field opens the gap, the ions in the storage magnetic field fly out along the tangential direction of the gap and enter the magnetic analysis component through the deflection magnetic field.

Figure 8:
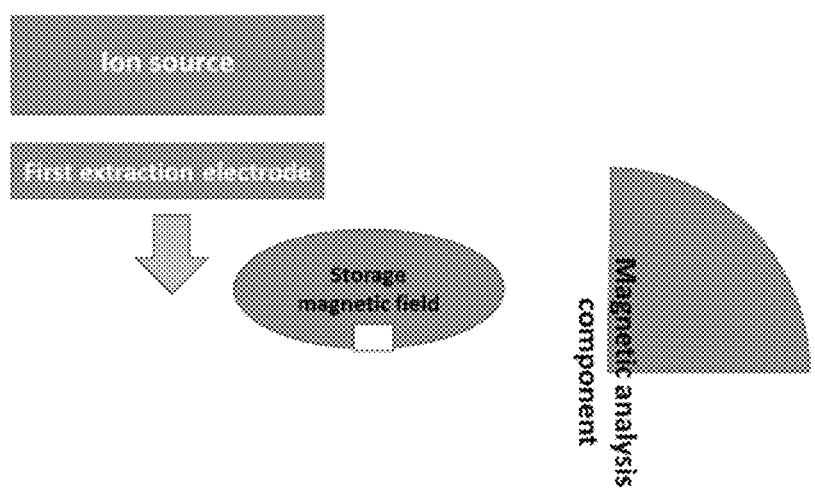
FIG. 8 is a schematic diagram of a third ion emitting device for increasing ion implantation beam current.

③. As shown in FIG. 8, a removable gap is provided with the storage magnetic field, and the magnetic analysis component is arranged along the tangential direction of the removable gap, when the number of the ions in the stored magnetic field reaches a predetermined value, the removable gap of the storage magnetic field is opened, so that the ions in the storage magnetic field moves to the magnetic analysis component along the tangential direction of the gap.

Figure 9:
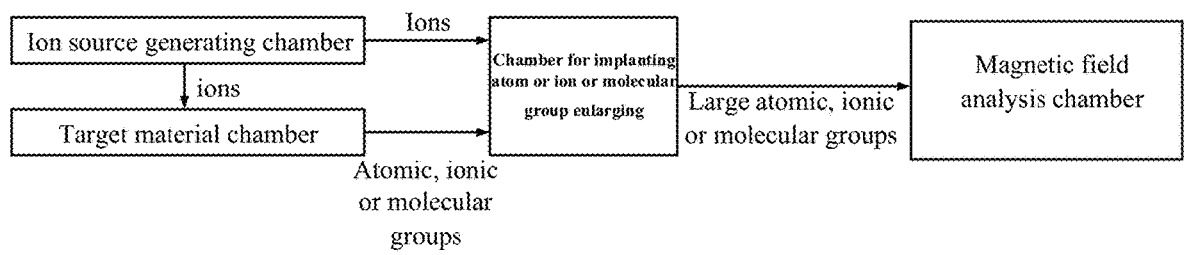
FIG. 9 is a schematic diagram of an ion emitting device for realizing cluster ion implantation.

As shown in FIG. 9, the ion emitting device of the present disclosure may also include an ion source generating chamber for generating an ion source; in the ion source generating chamber, the direct-current high-voltage discharge is adopted to generate plasma; a part of the plasma can be led out to the target material chamber through the magnetic field.

Now, let's look at target material chamber, the part of the ion source coming out of the ion source generating chamber enters the target material chamber to bombard the target material; so that the ions, the atoms, the molecules, and the atomic groups which are bombarded out from the target material and colliding with each other, so as to generate the atomic groups. In the target material chamber, an electric field is adopted to accelerate the ion source to bombard the target material, and the formed atomic groups are through an electric field enter into a chamber for implanting atomic or ionic or molecular group enlarging. In order to effectively bombard the atomic group, the molecule and the like, the target material can be placed in a tilted position or be arranged in an inner conical shape.

Now, let's look at the chamber for implanting atomic or ionic or molecular group enlarging. The atomic groups coming out of the target material chamber enter the chamber for implanting atomic or ionic or molecular group enlarging, and meanwhile, a part of the ion source coming out of the ion source generating chamber can enter the chamber for implanting atomic or ionic or molecular group enlarging through the magnetic field and collide with the atomic groups from the target material chamber to enable the atomic groups to be electrified, and therefore the ratio of the charged large atomic or ionic or molecular group is increased. In order to form effective collides, in the present embodiment, and a part of ion sources coming out of the ion source generating chamber is subjected to spiral motion in the chamber for implanting atomic or ionic or molecular group enlarging to collide the atomic group from the target material chamber so as to enable the atomic groups to be electrified.

Now, let's look at the magnetic field analysis chamber. The large atomic or ionic or molecular groups from the chamber for implanting atomic or ionic or molecular group enlarging can enter the magnetic field analysis chamber through the magnetic field and is subjected to charge-to-mass ratio screening, the charged atomic groups with required charge-to-mass ratio are selected.

While the present disclosure has been particularly shown and described with references to preferred embodiments thereof, it will be understood by those skilled in the art that various changes in form and details may be made therein without departing from the spirit and scope of the present disclosure as defined by the appended claims.

What is claimed is:

1. An ion implantation system comprises: an ion emitting device and a target plate device, wherein the target plate device comprises a target plate and a support frame, and the target plate is used for placing a wafer to be processed which is mounted on the upper end of the support frame; the ion beam emitted by the ion emitting device enters the target plate device and is implanted into the wafer to be processed so as to realize the ion implantation process; wherein, the target plate device further comprises a graphite electrode unit and a power supply unit, the graphite electrode unit is mounted on the lower end of the support frame, and the graphite electrode unit is a hollow structure; the graphite electrode unit comprises a graphite electrode and a hollow region I, the graphite electrode is connected with the power supply unit; the area of the hollow region I is smaller than that of the wafer to be processed, the sum of the area of the graphite electrode and the area of the hollow region I is larger than the implantation area of the ion beam, the center of the wafer to be processed and the center of the hollow region I are located on the same straight line parallel to the implanted direction of the ion beam; when the ion beam is implanted on the wafer to be processed on the target plate for ion implantation, the power supply unit applies a voltage to the graphite electrode to generate an electric field in the opposite direction from the electric field generated by the ion beam motion, for reducing the speed of the ion beam implanted to a location outside the wafer to be processed; wherein a shielding unit is arranged between the target plate and the graphite electrode, and the shielding unit is a hollow structure, the shielding unit comprises a hollow region II and a shielding region, the shielding region and the graphite electrode form a capacitor.

2. The ion implantation system of claim 1, wherein the area of the target plate is smaller than that of the wafer to be processed.

3. The ion implantation system of claim 1, wherein the area of the hollow region II and the area of the hollow region I are the same, and the center of the hollow region II and the center of the hollow region I are located on the same straight line parallel to the implanted direction of the ion beam, the sum of the area of the hollow region II and the area of the shielding region is larger than the area of the wafer to be processed.

4. The ion implantation system of claim 3, wherein, the shielding region is a porous grounding electrode or an electron region implanted by an electron gun.

5. The ion implantation system of claim 1, wherein the target plate device further comprises a faraday cup array, a micro-magnetic field array, and a control unit, the faraday cup array is composed of faraday cups arranged on the same plane, the faraday cup array and the wafer to be processed are located on the same plane, and the positions in the plane can be switched; a micro-magnetic field array is arranged above the target plate towards the ion beam, and the control unit is connected with the micro-magnetic field array and the faraday cup array respectively; when the ion beam is implanted, the faraday cup array is switched to the ion beam implantation position, the ion beam passing through the faraday cups at different positions in the faraday cup array to obtain current values corresponding to the ion beam at different positions, and the current values are fed back to the control unit, the control unit adjusts the micro-magnetic field array according to the current values, the micro-magnetic field array adjusts the ion beam until the current values corresponding to the faraday cups at different positions in the faraday cup array are equal; here, the wafer to be processed is switched to the ion beam implantation position; the ion implantation is carried out on the wafer to be processed on the target plate by the ion beam.

6. The ion implantation system of claim 5, wherein the area of the faraday cup array is smaller than or equal to the area of the ion beam, the area of the micro-magnetic field array is larger than implantation area of the ion beam, and the micro-magnetic field array is an annular micro-magnetic field array.

7. The ion implantation system of claim 1, wherein the ion emitting device comprises an ion source, a first extraction electrode, a storage magnetic field, and a magnetic analysis component, the first extraction electrode is arranged in the outlet direction of the ion source, the storage magnetic field is deflected by a certain angle relative to the outlet direction of the first extraction electrode, and the angle enables the ions passing through the first extraction electrode to enter the storage magnetic field to do circular motion; the storage magnetic field is an annular magnetic field, the magnetic analysis component is used for detecting and separating the ions in the storage magnetic field, and the ions ionized by the ion source are led out through the first extraction electrode, the ions out by the first extraction electrode enter the storage magnetic field to do circular motion; when the number of the ions in the storage magnetic field reaches a predetermined value, the ions in the storage magnetic field are released into the magnetic analysis component.

8. The ion implantation system of claim 7, wherein the ion emitting device further comprises a second extraction electrode, the second extraction electrode is arranged in the middle of the storage magnetic field and the magnetic analysis component; when the number of the ions in the storage magnetic field reaches a predetermined value, the ions in the storage magnetic field are led out by the second extraction electrode to the magnetic analysis component.

9. The ion implantation system of claim 7, wherein the storage magnetic field is provided with an openable gap, and the magnetic analysis component is arranged in the tangential direction of the gap; when the number of the ions in the storage magnetic field reaches a predetermined value, the storage magnetic field opens the gap, and the ions in the storage magnetic field moves to the magnetic analysis component along the tangent line of the gap.

10. The ion implantation system of claim 7, wherein the ion emitting device further comprises a deflection magnetic field, the storage magnetic field is provided with an openable gap, the deflection magnetic field is connected with the gap of the storage magnetic field and the magnetic analysis component; when the number of the ions in the storage magnetic field reaches a predetermined value, the storage magnetic field opens the gap, the ions coming out of the storage magnetic field enters the magnetic analysis component through the deflection magnetic field.

11. The ion implantation system of claim 1, wherein the ion emitting device comprises an ion source generating chamber, a target material chamber, a chamber for implanting atomic or ionic or molecular group enlarging and a magnetic field analysis chamber, the ion source generating chamber is used for generating ion source, and a part of the ion source coming out of the ion source generating chamber enters the target material chamber to bombard the target material, so that the ions, the atoms, the molecules, and the atomic groups are bombarded out from the target material and colliding with each other, so as to generate the atomic groups; the atomic groups from the target material chamber enter into the chamber for implanting atomic or ionic or molecular group enlarging; meanwhile, a part of the ion source coming out of the ion source generating chamber enter the chamber for implanting atomic or ionic or molecular group enlarging and is subjected to spiral motion to collide with the atomic groups from the target material chamber to enable the atomic groups to be electrified so that the ratio of the charged large atomic or ionic or molecular groups is increased; the large atomic or ionic or molecular groups from the chamber for implanting atomic or ionic or molecular group enlarging enters the magnetic field analysis chamber and are subjected to charge-to-mass ratio screening, and the charged atomic groups with the required charge-to-mass ratio are selected.

12. The ion implantation system of claim 11, wherein the target material is placed in a tilted position or in an inner conical shape in the target material chamber.

\* \* \* \* \*